(12) United States Patent
Harvey et al.

(10) Patent No.: US 10,317,502 B2
(45) Date of Patent: Jun. 11, 2019

(54) MAGNETIC RESONANCE IMAGING WITH RF NOISE DETECTION COILS

(71) Applicant: KONINKLIJKE PHILIPS N.V., Eindhoven (NL)

(72) Inventors: Paul Royston Harvey, Eindhoven (NL); Michael Jozef Duijvestijn, Eindhoven (NL); Steve Lorenc, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 130 days.

(21) Appl. No.: 15/129,124

(22) PCT Filed: Mar. 26, 2015

(86) PCT No.: PCT/EP2015/056618
§ 371 (c)(1),
(2) Date: Sep. 26, 2016

(87) PCT Pub. No.: WO2015/150236
PCT Pub. Date: Oct. 8, 2015

(65) Prior Publication Data
US 2017/0108569 A1 Apr. 20, 2017

(30) Foreign Application Priority Data
Mar. 31, 2014 (EP) .................................. 14162602

(51) Int. Cl.
*G01R 33/36* (2006.01)
*G01R 33/58* (2006.01)
(Continued)

(52) U.S. Cl.
CPC ......... *G01R 33/5659* (2013.01); *G01R 33/36* (2013.01); *G01R 33/3607* (2013.01); *G01R 33/422* (2013.01); *G01R 33/583* (2013.01)

(58) Field of Classification Search
CPC .... G01R 33/36; G01R 33/3607; G01R 33/56; G01R 33/565; G01R 33/5608;
(Continued)

(56) References Cited

U.S. PATENT DOCUMENTS 4,613,820 A 9/1986 Edelstein et al.
5,019,778 A * 5/1991 Mens ............... G01R 33/34076
324/318
(Continued)

FOREIGN PATENT DOCUMENTS

JP 03188831 A 8/1991

OTHER PUBLICATIONS

Somasundaram S D et al: "Countering Radio Frequency Interference in Single-Sensor Quadrupole Resonance", IEEE Geoscience and Remote Sensing Letters, IEEE Service Center, New York, NY, US, vol. 6, No. 1, Jan. 1, 2009 (Jan. 1, 2009),pp. 62-66.
(Continued)

*Primary Examiner* — Son T Le (57) ABSTRACT

The invention provides for a magnetic resonance imaging system (100) for acquiring magnetic resonance data (142, 144) from an imaging zone (108). Execution of the instructions causes a processor (133) controlling the MRI system to: acquire (200) imaging magnetic resonance data (142) with radio frequency excitation of the radio frequency system enabled; acquire (202) noise radio frequency data (148) using at least one RF noise detection coil, wherein the noise radio frequency data is acquired simultaneously with the imaging magnetic resonance data; acquire (204) calibration magnetic resonance data (144) with radio frequency excitation of the radio frequency system disabled; acquire (206) reference radio frequency data (146) using the at least one RF noise detection coil, wherein the reference radio frequency data is acquired simultaneously with the calibra-
(Continued)

tion magnetic resonance data; and calculate (208) a noise calibration (150) using the reference radio frequency data and the calibration magnetic resonance data.

15 Claims, 6 Drawing Sheets

(51) Int. Cl.
*G01R 33/565* (2006.01)
*G01R 33/422* (2006.01)

(58) Field of Classification Search
CPC .. G01R 33/5659; G01R 33/58; G01R 33/583; G01R 33/422; G01R 33/0029; G01R 33/3854
See application file for complete search history.

(56) References Cited

U.S. PATENT DOCUMENTS

| | | | |
|---|---|---|---|
| 5,125,108 A | 6/1992 | Talwar | |
| 6,208,135 B1 | 3/2001 | Shattil | |
| 6,968,171 B2 | 11/2005 | Vanderhelm et al. | |
| 7,486,982 B2 | 2/2009 | Branch et al. | |
| 8,249,540 B1 | 8/2012 | Gupta et al. | |
| 2008/0048658 A1* | 2/2008 | Hushek | G01R 33/422 324/309 |
| 2008/0272782 A1* | 11/2008 | Lin | G01R 33/482 324/312 |
| 2010/0246756 A1* | 9/2010 | Forthmann | A61B 6/032 378/16 |
| 2013/0084023 A1 | 4/2013 | Corum et al. | |
| 2013/0119981 A1* | 5/2013 | Choi | G01R 33/36 324/307 |
| 2013/0296689 A1* | 11/2013 | Okamoto | G01R 33/34046 600/411 |
| 2014/0070810 A1 | 3/2014 | Robert et al. | |
| 2014/0155732 A1* | 6/2014 | Patz | A61B 5/055 600/410 |

OTHER PUBLICATIONS

Hoeldrich and Lorber, "Real-time Broadband Noise Reduction," International Computer Music Conference Proceedings 1998, http://hdl.handle.net/2027/spo.bbp2372.1998.317.

* cited by examiner

MAGNETIC RESONANCE IMAGING WITH RF NOISE DETECTION COILS

CROSS REFERENCE TO RELATED APPLICATIONS

This application is a U.S. national phase application of International Application No. PCT/EP2015/056618, filed on Mar. 26, 2015, which claims the benefit of EP Application Serial No. 14162602.8 filed on Mar. 31, 2014 and is incorporated herein by reference.

TECHNICAL FIELD OF THE INVENTION

The invention relates to magnetic resonance imaging, in particular to magnetic resonance imaging in the presence of spurious RF signals.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the B1 field.

However, spurious RF noise during the MRI scan can interfere with the measurement of the RF signals emitted by the nuclear spins. Typically a large RF cage is built around the magnetic resonance imaging system to eliminate these spurious RF signals. A disadvantage to using the such an RF cage is that it uses large amounts of metal such as copper and is expensive to build.

U.S. Pat. No. 4,613,802 discloses a radio-frequency shielded room for a nuclear magnetic resonance imaging system.

U.S. Pat. No. 7,486,982 B2 discloses a radio-opaque holder in combination with radio-opaque magnet components to form an RF shield around a patient undergoing an NMR procedure.

The international application WO2013/016639 discloses an active noise cancellation system in a portable MR system.

SUMMARY OF THE INVENTION

The invention provides for a magnetic resonance imaging system, a method, and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa. The contents of the memory and storage may duplicate each other or items depicted as being in one may be stored or copied in the other.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer. Magnetic resonance data may also be referred to as k-space data.

In one aspect the invention provides for a magnetic resonance imaging system for acquiring magnetic resonance data from an imaging zone. The magnetic resonance imaging system comprises a magnet for generating a main magnetic field in the imaging zone. The magnetic resonance imaging system further comprises a radio-frequency system comprising a magnetic resonance antenna for sending and receiving radio-frequency transmissions within a predetermined bandwidth. The magnetic resonance antenna comprises at least one antenna element. The at least one antenna element is within the imaging zone. The magnetic resonance imaging system further comprises at least one RF noise detection coil for detecting radio-frequency signals within the predetermined bandwidth. An RF noise detection coil may also be referred to as a sniffer coil or an RF sniffer element herein. The at least one RF noise detection coil is positioned outside of the imaging zone.

The magnetic resonance imaging system further comprises a memory containing machine-executable instructions for example for execution by a processor. The memory further contains pulse sequence data. Pulse sequence data as used herein encompasses data which may be used by a processor to control the magnetic resonance imaging system to perform a magnetic resonance imaging protocol. In other words the pulse sequence data is a sequence of commands which the processor may issue to the magnetic resonance imaging system which control it to acquire the magnetic resonance data. The magnetic resonance imaging system further comprises a processor for controlling the magnetic resonance imaging system. Execution of the machine-executable instructions causes the processor to acquire imaging magnetic resonance data by controlling the magnetic resonance imaging system with the pulse sequence data. During the acquisition of the imaging magnetic resonance data the radio-frequency excitations with the radio-frequency system are enabled. This is the normal way of acquiring magnetic resonance data.

Execution of the instructions further cause the processor to acquire noise radio-frequency data using the at least one RF noise detection coil. The noise radio-frequency data is acquired simultaneously with the imaging magnetic resonance data. As the radio-frequency antenna is used in the acquisition of the magnetic resonance data the at least one RF noise detection coil is used to make measurements which are used to determine the noise at a particular instant in time.

Execution of the machine-executable instructions further cause the processor to acquire calibration magnetic resonance data by controlling the magnetic resonance imaging system with pulse sequence data while the radio-frequency excitation of the radio-frequency system is disabled. Execution of the machine-executable instructions further cause the processor to acquire reference radio-frequency data using the at least one RF noise detection coil, the reference radio-frequency data is acquired simultaneously with the calibration magnetic resonance data. The calibration magnetic resonance data and the reference radio-frequency data are acquired at the same time. Since the radio-frequency excitation that is normally specified in the pulse sequence has been disabled, both the calibration magnetic resonance data and the reference radio-frequency data are only noise measurements. The measurement of the noise using the detection coil at the same time as measuring noise using the magnetic resonance antenna enables a mapping or calibration to be constructed using these two sets of data.

In another embodiment execution of the machine executable instructions further causes the processor to generate corrected imaging magnetic resonance data using the noise radio frequency data, the noise radio frequency data, and the noise calibration. The corrected imaging magnetic resonance data may for instance be used to reconstruct a magnetic resonance image.

In another embodiment execution of the machine-executable instructions further causes the processor to calculate a noise calibration using the reference radio-frequency data and the calibration magnetic resonance data. This embodiment may be useful because a noise calibration has been calculated which may be compared to the noise radio-frequency data to estimate the level of noise in the imaging magnetic resonance data or even to correct the imaging magnetic resonance data. It should be noted that the imaging magnetic resonance data or the calibration magnetic resonance data can be acquired first. The noise calibration can be made before the imaging magnetic resonance data is acquired or it may also be done after the imaging magnetic resonance data is acquired.

In another embodiment the noise calibration is frequency dependent, phase dependent, and amplitude dependent. Execution of the machine-executable instructions further causes the processor to detect one or more radio-frequency noise events using the noise radio-frequency data. Execution of the instructions further causes the processor to determine a noise event phase, a noise event frequency, and a noise event amplitude for each of the one or more RF noise events. Execution of the instructions further cause the processor to correct each of the RF noise events in the imaging magnetic resonance data using the noise calibration and the noise event phase, noise event frequency, and the noise event amplitude.

The noise calibration may for instance be made by examining the calibration magnetic resonance data and comparing this to reference radio-frequency data. For instance events over a certain amplitude within the noise calibration magnetic resonance data or the reference radio-frequency data may be classified as noise and then the signal on the reference radio-frequency data and the reference radio-frequency data can be compared. For example, this may used to generate or calculate a mapping relating the phase and amplitude of the noise event as measured by an antenna element to the and phase and amplitude of the noise event measured on the RF noise detection coil. This allows a mapping between the frequency, phase, and amplitude. It is unlikely that there would be a frequency difference for the same noise event on both the RF noise detection coil and an antenna element. However if there were a frequency difference such a mapping could be made also. The comparison between the data measured on the RF noise detection coil and the antenna element for a particular frequency for a signal of a particular frequency phase and amplitude enables the construction of a direct mapping.

If the reference radio-frequency data is measured for a significantly long enough time then a reasonably complete mapping or noise calibration can be constructed. For instance a noise event can be measured in the noise radio-frequency data and then using the noise calibration a mapping onto the antenna elements can be calculated. The noise data can then be subtracted in a number of different ways from the imaging magnetic resonance data.

The determination of the noise calibration may permit the determination of the noise signal measured by one or more antenna elements during the acquisition of magnetic resonance data by detecting noise measured by an RF noise detection coil. Any noise component in the real magnetic resonance data can thus be subtracted from the magnetic resonance data by using the mapping and measured signals from the RF noise detection coil.

In another embodiment the noise calibration is calculated by determining a frequency dependent mapping that is descriptive of the phase and amplitude measurements made with the at least one RF noise detection coil and each of the at least one antenna elements. This may enable noise on each of the at least one antenna elements to be corrected for.

It should be noted that there may also be multiple RF noise detection coils. In this case a calibration can be constructed for each RF noise detection coil and mapping this onto each of the at least one antenna elements. When using multiple RF noise detection coils a variety of schemes may be used. For instance the noise that each one calculates may be averaged for each of the RF noise detection coils.

In another embodiment each of the RF noise events is corrected by: calculating a temporally dependent noise signal for each of the at least one antenna elements using the noise calibration and the noise event phase, noise event frequency, and the noise event amplitude, and subtracting the temporally dependent noise signal from the imaging magnetic resonance data. This embodiment may have the benefit of calculating a noise signal on each of the at least one antenna elements in a straight forward and simple way.

In another embodiment subtraction of the temporally dependent noise signal from the imaging magnetic resonance data is performed in k-space. The measurements for magnetic resonance data measure the magnetic resonance imaging signal in k-space. The corrections can be performed directly in k-space.

In another embodiment execution of the instructions further cause the processor to subtract the temporally dependent noise signal from the imaging magnetic resonance data by transforming the imaging magnetic resonance data into a preliminary magnetic resonance image, transforming the temporally dependent noise signal into a noise image, and calculating a final magnetic resonance image by subtracting the noise image from the preliminary magnetic resonance image. The intensity or value of a voxel in a magnetic resonance image is proportional to the MR signal. The contribution to the noise by a particular noise signal is also proportional to the strength of the noise. The noise may therefore be removed after the images have been reconstructed by subtracting them.

In another embodiment the one or more RF noise events is determined by thresholding the reference radio-frequency data. This embodiment may be beneficial because it avoids subtracting low levels of noise which may be difficult to compensate for. This embodiment provides for a means of removing spurious radio-frequency radiation from the imaging magnetic resonance data.

In another embodiment the magnetic resonance imaging system may use a digital filter to remove the noise signal from the imaging magnetic resonance data. For instance the noise calibration could be used to construct a digital filter which uses the imaging magnetic resonance data and the noise radio-frequency data as inputs. The output of the digital filter is then the imaging magnetic resonance data with noise subtracted from it.

Whilst noise removal can be performed fully in the image domain, the process of data acquisition in a modern MRI system involves digital sampling of the MRI signal at a sample frequency significantly higher than bandwidth of information it contains. Demodulation and down-sampling of the digitized MRI signal is typically performed in the digital domain involving e.g. a resampling filter on the time domain data. Depending on the complexity of the noise source it can be convenient to construct a custom filter from the acquired noise signature that is applied by convolution in the time domain during the process of digital demodulation and resampling. Such an approach can be effective at suppressing periodic point frequencies and constant broad band noise. In such an embodiment, the noise suppression would take place directly inside the digital receiver of the MRI system. The output from the digital receiver would then be the de-noised data. The following embodiment describes such an exemplary resampling filter.

In another embodiment execution of the machine-executable instructions further causes the processor to divide the noise radio-frequency data into noise temporal frames. In some examples the temporal frames may be for a time to acquire a line of k-space or for several lines of k-space. Execution of the instructions further causes the processor to divide the imaging magnetic resonance data into data temporal frames. There is a data temporal frame selected from the data temporal frames that corresponds in time to a noise temporal frame that is selected from the noise temporal frames. In other words both the imaging magnetic resonance data and the noise radio-frequency data are divided into short time intervals. Each of these short time intervals are referred to as temporal frames. The noise radio-frequency data and the imaging magnetic resonance data are divided into these frames such that for each frame of the noise radio-frequency data there is a corresponding frame of imaging magnetic resonance data. Execution of the instructions further cause the processor to calculate a short-time measured noise spectrum for each of the noise temporal frames. Execution of the instructions further cause the processor to calculate a short-time calculated noise spectrum for each short-time measured noise spectrum using the noise calibration. Each of the noise temporal frames for instance may have its Fourier transform performed so that a spectrum of the received radio-frequency data is created. This has an amplitude and frequency determination.

Execution of the instructions further cause the processor to calculate a short-time data spectrum (or short term Fourier transform) for each of the data temporal frames. In the same way the Fourier transform of each data temporal frame is created such that a radio-frequency spectrum is created. Next each of the short-time calculated noise spectrum is binned into noise frequency bins by execution of the instructions by the processor. Execution of the machine-executable instructions further cause the processor to bin each short-time data spectrum into data frequency bins. The binning of the short-time calculated noise and the short-time data spectrum is performed using identical frequency bins. The data for both the noise and the measurement has been broken into small timeframes then a spectrum has been calculated for each and then this is binned according to frequencies. Next execution of the machine-executable instructions further causes the processor to calculated corrected data frequency bins by subtracting the noise frequency bins from the data frequency bins using identical frequency bins.

Execution of the instructions further cause the processor to re-synthesize the imaging magnetic resonance data using the corrected data frequency bins and an original phase spectrum of the imaging magnetic resonance data. This particular technique may be applied after the data has been acquired or it may also be performed on the fly.

These operations may be performed inside a digital receiver. They could also be done on the fly as frames are measured or could be done afterwards after the data has been finished being acquired.

The above described digital filter is similar to the digital filter described in Hoeldrich and Lorber, "Real-time Broadband Noise Reduction," International Computer Music Conference Proceedings 1998, http://hdl.handle.net/2027/spo.bbp2372.1998.317 with a few additional features. In the present embodiment the short-time spectrum used to predict the noise is taken from a separate source, the RF noise detection coil. The terminology in the above embodiment matches the terminology used in this conference proceeding.

In applying noise reduction to magnetic resonance imaging it should be noted that it is possible to acquire individual lines of k-space and perform Fourier Transformation (FT) of those individual lines. In some examples, the duration of the acquisition of a k-space line or lines is so such that they could be considered directly as individual frames in the context of the STFT (Short Time Fourier Transform) as described above for the Hoeldrich and Lorber article.

The STFT for MRI may be applied differently than is applied in the article by Hoeldrich and Lorber. In Hoeldrich and Lorber it is assumed that a continuous stream of time domain data and performs a Fourier Transform (FT) on a selected window size as the data passes through. Thus, while the window size is fixed, the data from two successive FTs on the window can contain part of the same data. This is typically how real-time FT is performed (using the overlap and add method). However, the STFT is not necessary for MRI data since the data is already acquired as demarcated independent or acquired in discrete lines or groups of k-space. In this case the time frames are separate frames in which no data is shared from previous frames. The rest of the processing described in Hoeldrich and Lorber with respect to the noise floor removal is still valid but a STFT is not required in MRI.

In another embodiment execution of the instructions further causes the processor to reconstruct a magnetic resonance image using the imaging magnetic resonance data after the imaging magnetic resonance data has been corrected or had noise removed.

In another embodiment the magnet is a cylindrical magnet with a bore. The magnetic resonance antenna is a body coil located within the bore. The at least one antenna element is positioned within the bore of the magnet. This embodiment may be beneficial because the correction of the noise may be done from measurements acquired with a body coil. A body coil as used herein may also be referred to as a bird cage coil.

In another embodiment the magnetic resonance antenna is a surface coil.

In another embodiment the at least one antenna element is a loop antenna element.

In another embodiment the at least one RF noise detection coil is a loop antenna. The loop antenna element could have approximately the same surface area and tuning as the loop antenna. Additionally the RF noise detection coil could be positioned so it is approximately oriented the same way that the element in the surface coil or an antenna element in a loop antenna element would be positioned. For instance the antenna elements may be placed on top of a subject. In this case a preferable position to place the loop antenna of the RF noise detection coil would be planar or horizontal.

In another embodiment the predetermined bandwidth is between 1 kHz and 1 MHz.

In another embodiment either the imaging magnetic resonance data or the calibration magnetic resonance data may be acquired first. The method may be performed before the measurement of a subject is made or it may be performed afterwards.

In another embodiment execution of the instructions further cause the processor to generate a magnetic resonance image using the imaging magnetic resonance data. This may for instance be performed after the noise has been removed from the imaging magnetic resonance data.

In another aspect the invention provides for a computer program product comprising machine-executable instructions for execution by a processor controlling the magnetic resonance imaging system. The magnetic resonance imaging system comprises a magnet for generating a main magnetic field in the imaging zone. The magnetic resonance imaging system further comprises a radio-frequency system comprising a magnetic resonance antenna for sending and receiving radio-frequency transmissions within a predetermined bandwidth. The magnetic resonance antenna comprises at least one antenna element. The at least one antenna element is within the imaging zone. The magnetic resonance imaging system further comprises at least one RF noise detection coil for detecting radio-frequency signals within the predetermined bandwidth. The at least one RF noise detection coil is positioned outside of the imaging zone. The magnetic resonance imaging system further comprises a memory containing pulse sequence data. Execution of the machine-executable instructions causes the processor to acquire imaging magnetic resonance data by controlling the magnetic resonance imaging system with the pulse sequence data with the radio-frequency excitation of the radio-frequency system enabled.

Execution of the machine-executable instructions further causes the processor to acquire noise radio-frequency data using the at least one radio-frequency noise detection coil. The noise radio-frequency data is acquired simultaneously with the imaging magnetic resonance data. Execution of the machine-executable instructions further cause the processor to acquire calibration magnetic resonance data by controlling the magnetic resonance imaging system with the pulse sequence data. The radio-frequency excitation of the radio-frequency system is disabled during acquisition of the calibration magnetic resonance data. Execution of the machine-executable instructions further cause the processor to acquire reference radio-frequency data using the at least one RF noise detection coil. The reference radio-frequency data is acquired simultaneously with the calibration magnetic resonance data. Execution of the machine-executable instructions further causes the processor to calculate a noise calibration using the reference radio-frequency data and the calibration magnetic resonance data.

In another aspect the invention provides for a method of operating a magnetic resonance imaging system for acquiring magnetic resonance data from an imaging zone. The magnetic resonance imaging system comprises a magnet for generating a main magnetic field in the imaging zone. The magnetic resonance imaging system further comprises a radio-frequency system comprising a magnetic resonance antenna for sending and receiving radio-frequency transmissions within a predetermined bandwidth. The magnetic resonance antenna comprises at least one antenna element. The at least one antenna element is within the imaging zone. The magnetic resonance imaging system further comprises at least one RF noise detection coil for detecting radio-frequency signals within the predetermined bandwidth. The at least one RF noise detection coil is positioned outside of the imaging zone.

The method comprises the step of acquiring imaging magnetic resonance data by controlling the magnetic resonance imaging system with pulse sequence data such that the radio-frequency excitation of the radio-frequency system is enabled. The method further comprises the step of acquiring noise radio-frequency data using the at least one RF noise detection coil. The noise radio-frequency data is acquired simultaneously with the imaging magnetic resonance data. The method further comprises the step of acquiring calibration magnetic resonance data by controlling the magnetic resonance imaging system with the pulse sequence data such that the radio-frequency excitation of the radio-frequency system is disabled. The method further comprises the step of acquiring reference radio-frequency data using the at least one RF noise detection coil. The reference radio-frequency data is acquired simultaneously with the calibration magnetic resonance data. The method further comprises calculating a noise calibration using the reference radio-frequency data and the calibration magnetic resonance data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
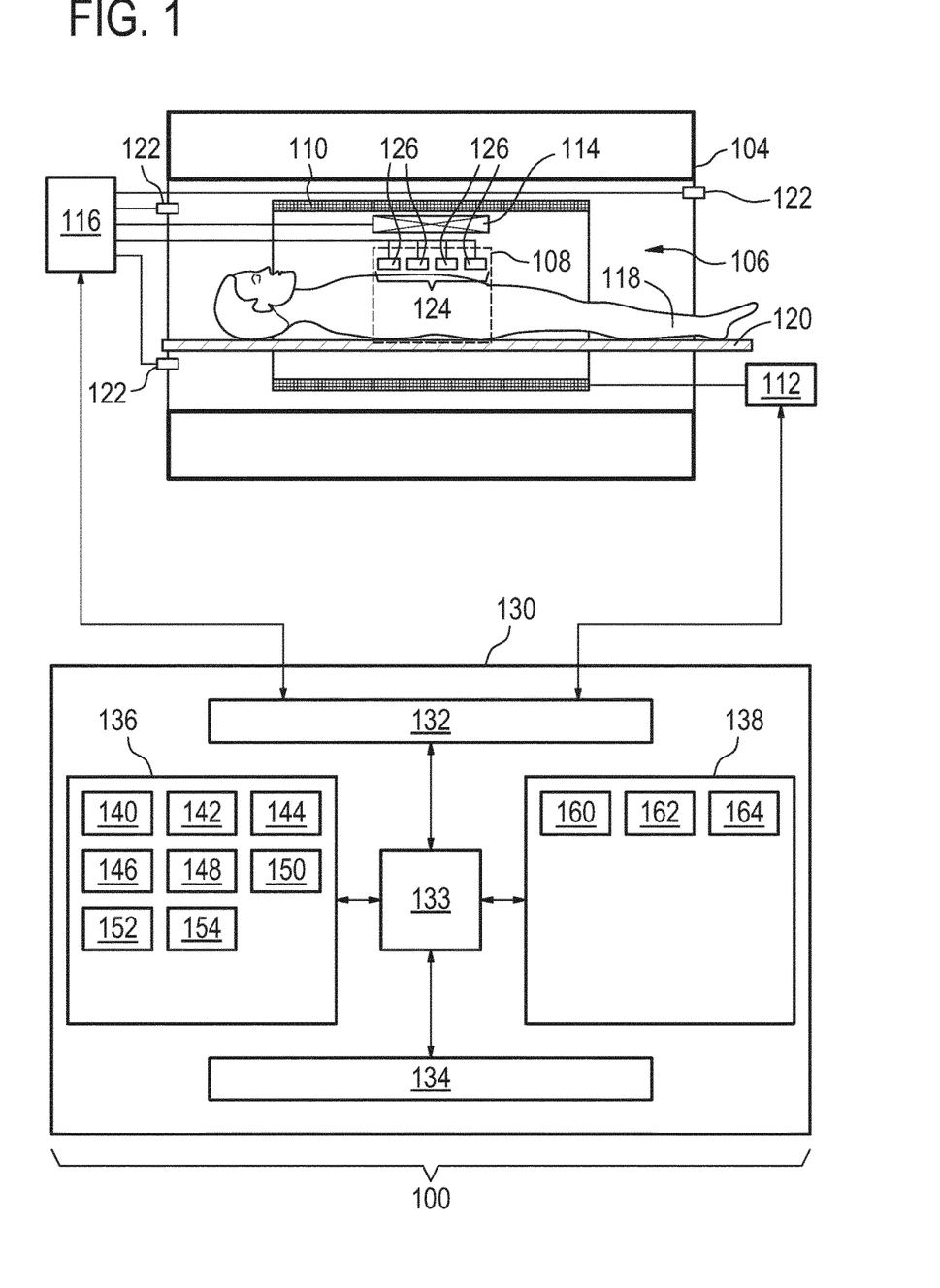
FIG. 1 illustrates an example of a magnetic resonance imaging system.

FIG. 1 shows an example of a magnetic resonance imaging system 100. The magnetic resonance imaging system 100 comprises a magnet 104. The magnet 104 is a superconducting cylindrical type magnet 104 with a bore 106 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed. A subject support 120 supports a subject 118 within the imaging zone 108.

Within the bore 106 of the magnet 104 is a body coil 114. The body coil 114 may be a QBC. The body coil 114 is shown as being connected to a transceiver 116. In some embodiments body coil 414 may also be connected to a whole body coil radio frequency amplifier and/or receiver, however this is not shown in this example. If both a transmitter and a receiver 116 are connected to the whole body coil 114, a means for switching between the transmit and receive mode may be provided. For example a circuit with a pin diode may be used to select the transmit or receive mode.

The transceiver 116 is shown as being connected to a magnetic resonance imaging coil 124. In this example the magnetic resonance imaging coil 124 is a surface coil comprising multiple antenna elements 126.

The transceiver 116 is shown as being further connected to several RF noise detection coils. The transceiver is a multi-channel transceiver. In some embodiments the transceiver may be split into several different units. However, it may be beneficial to use additional channels of the transceiver 116 for the RF noise detection coils as the signals acquired will be handled in the same way as data acquired using the antennas 114, 124.

The transceiver 116 and the magnetic field gradient coil power supply 112 are shown as being connected to a hardware interface 132 of a computer 130. The computer 130 is further shown as containing a processor 133 which is operable for executing the machine-readable instructions. The computer 130 is further shown as comprising a user interface 134, computer storage 136 and computer memory 138 which are all accessible and connected to the processor 133.

The magnetic resonance imaging system 100 is shown as having several RF noise detection coils 122 located in or near the bore 106 of the magnetic resonance imaging system. The RF noise detection coils 122 are placed away from the imaging zone 108. The signal that the RF noise detection coils 122 would measure would be predominantly noise or external RF noise as opposed to the coil 114 or 124 which measure noise plus magnetic resonance signals from the subject 118.

The computer storage 136 is shown as containing pulse sequence data 140. The computer storage 136 is further shown as containing imaging magnetic resonance data 142, calibration magnetic resonance data 144, reference radio-frequency data 146, and noise radio-frequency data 148. The imaging magnetic resonance data 142 was acquired using the pulse sequence data 140. The noise radio-frequency data 148 was acquired at the same time as the imaging magnetic resonance data 142. The calibration magnetic resonance data 144 was also acquired using the magnetic resonance data but the radio-frequency excitations were disabled. The reference radio-frequency data was acquired using the RF noise detection coils 122 at the same time the calibration magnetic resonance data 144 was acquired. The computer storage 136 is shown as further containing a noise calibration 150 which is calculated using the calibration magnetic resonance data and the reference radio-frequency data. The computer storage 136 is further shown as containing corrected imaging magnetic resonance data 152 and has had the noise signal removed from it using the noise calibration 150, the imaging magnetic resonance data 142 and the noise radio-frequency data 148. The computer storage 136 is further shown as containing a magnetic resonance image 154 that has been reconstructed from the corrected imaging magnetic resonance data 152.

The computer memory 138 is shown as containing a control module 160. The control module contains computer-executable code which enables the processor 133 to control the operation and function of the magnetic resonance imaging system 100. The control module 160 may contain computer-executable code which enables the processor to perform any one of the methods illustrated in FIG. 2, 3 or 4. The computer storage 138 is shown as optionally containing an image reconstruction module 162 which enables the processor 133 to reconstruct magnetic resonance images 154 from the magnetic resonance data 152. The computer memory 138 is further shown as containing an optional digital filter module 164 which implements a digital filter to perform the noise removal from the imaging magnetic resonance data 142 to generate or calculate the corrected imaging magnetic resonance data 152. The module 164 may for instance be calculated using the noise calibration 150.

Figure 2:
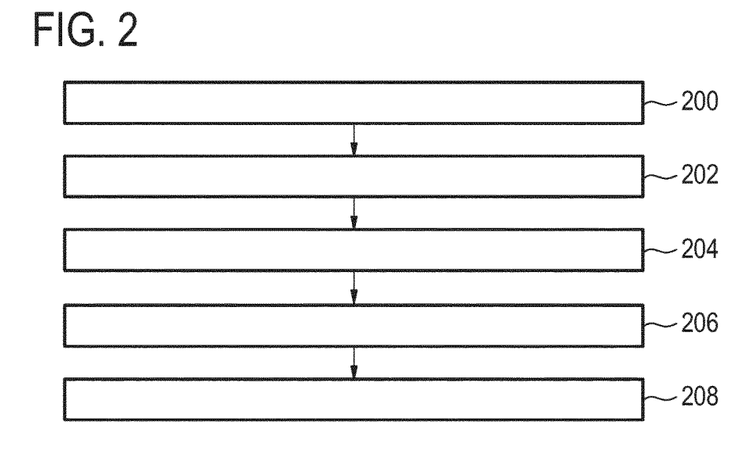
FIG. 2 shows a flow chart which illustrates an example of a method of operating the magnetic resonance imaging system of claim 1.

FIG. 2 shows a flow diagram which illustrates an example of a method for operating the magnetic resonance imaging system 100 of FIG. 1. First in step 200 imaging magnetic resonance data 142 is acquired by controlling the magnetic resonance imaging system 100 with pulse sequence data 140. The radio excitation of the radio-frequency system is enabled. Next in step 202 noise radio-frequency data 148 is acquired using the radio-frequency noise detection coils 122. This is done at the same time that the imaging magnetic resonance data 142 is acquired. Next in step 204 calibration magnetic resonance data 144 is acquired by controlling the magnetic resonance imaging system 100 with the pulse sequence data 140.

During the acquisition of the calibration magnetic resonance data 144 the radio-frequency excitation of the radio-frequency system is disabled. Next in step 206 reference radio-frequency data 146 is acquired using the RF noise detection coils 122. The reference radio-frequency data 146 is acquired at the same time that the calibration magnetic resonance data 144 is also acquired. Finally in step 208 a noise calibration 150 is calculated using the reference radio-frequency data 146 and the calibration magnetic resonance data 144.

Figure 3:
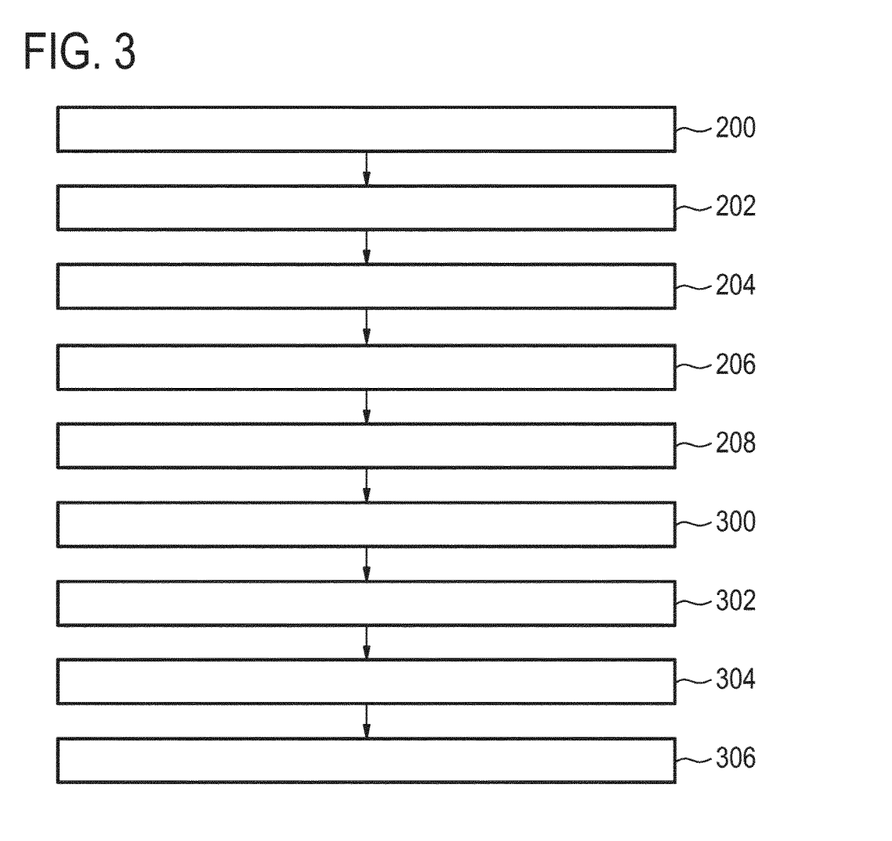
FIG. 3 shows a flow chart which illustrates a further example of a method of operating the magnetic resonance imaging system of claim 1.

FIG. 3 shows a flow diagram which illustrates a further method of operating the magnetic resonance imaging system of FIG. 1. FIG. 3 is a continuation of the method illustrated in FIG. 2. After step 208 the method continues in step 300 where one or more RF noise events are detected using the noise radio-frequency data 148. Next in step 302 a noise event phase, noise event frequency, and noise event amplitude is determined for each of the one or more RF noise events. Next in step 304 each of the RF noise events in the imaging magnetic resonance data 142 is corrected using the noise calibration 150 and the noise event phase, noise event frequency, and the noise event amplitude. Finally in step 306 a magnetic resonance image 154 is reconstructed from the corrected imaging magnetic resonance data 152 using the image reconstruction module 162.

Figure 4:
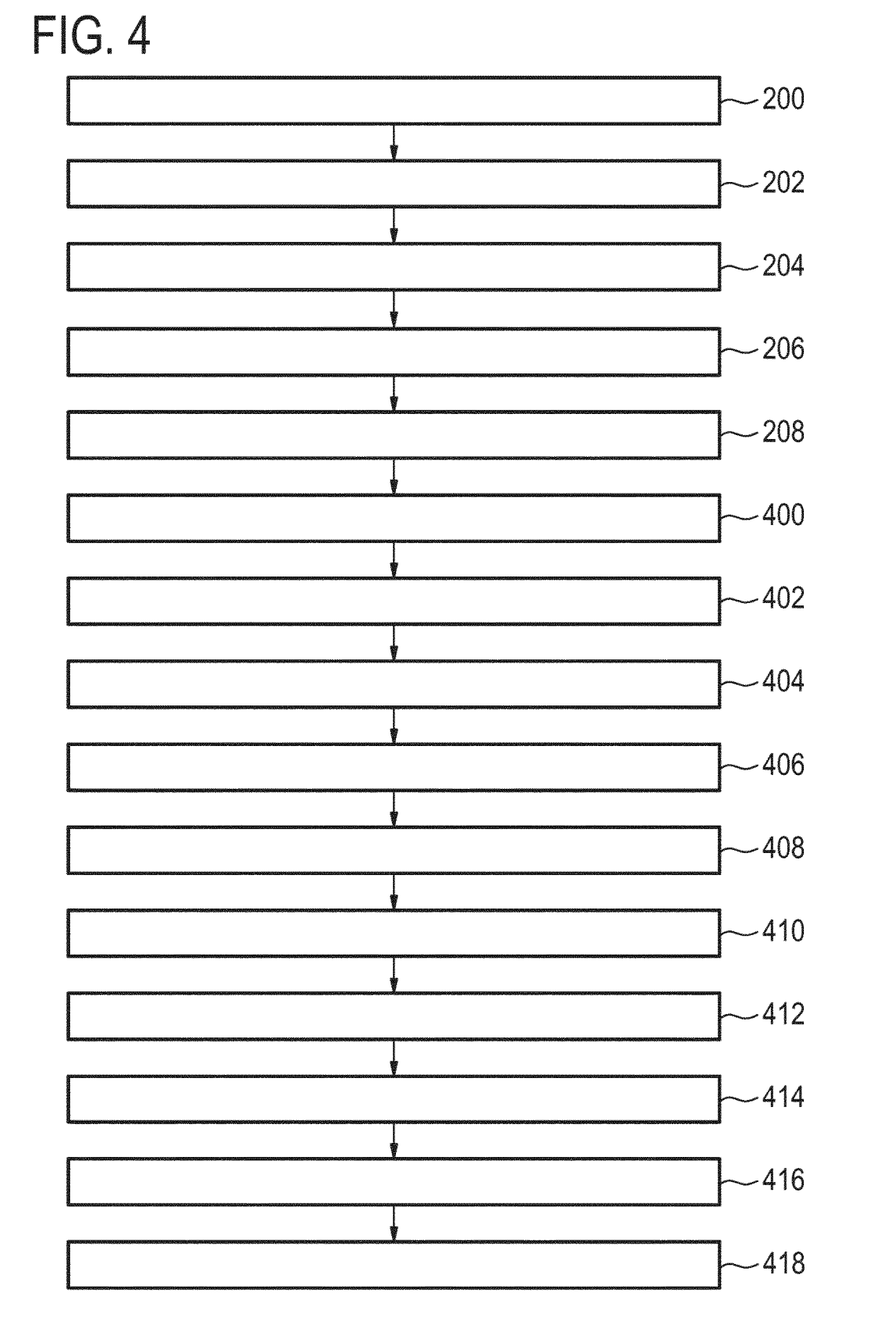
FIG. 4 shows a flow chart which illustrates a further example of a method of operating the magnetic resonance imaging system of claim 1.

FIG. 4 shows a flowchart which illustrates a further method of operating the magnetic resonance imaging system 100 of FIG. 1. The method shown in FIG. 4 is a continuation of the method shown in FIG. 2. After step 208 the method proceeds in step 400 where the noise radio-frequency data 148 is divided into noise temporal frames. Next in step 402 the imaging magnetic resonance data 142 is divided into data temporal frames. There is a data temporal frame selected from the data temporal frames that corresponds in time to a noise temporal frame selected from the noise temporal frames. The imaging magnetic resonance data and the noise radio-frequency data are both divided into the same temporal frames so that for each data temporal frame there is a noise temporal frame. Next in step 404 a short-time measured noise spectrum is calculated for each of the noise temporal frames. Then in step 406 a short-time calculated noise spectrum is calculated for each short-time measured noise spectrum using the noise calibration. The short-time calibration noise spectrum is a calculated value of the noise on a particular antenna element.

Next in step 408 a short-time data spectrum is calculated for each of the data temporal frames. Next in step 410 each short-time calculated noise spectrum is binned into noise frequency bins. Next in step 412 each short-time data spectrum is binned into data frequency bins. The binning of the short-time calculated noise spectrum is the same as the binning for the short-time data spectrum. The binning is performed using identical frequency bins. Next in step 414 corrected data frequency bins are calculated by subtracting the noise frequency bins from the data frequency bins using the identical frequency bins. Next in step 416 the imaging magnetic resonance data is re-synthesized using the corrected data frequency bins and an original phase spectrum of the imaging magnetic resonance data. For each temporal frame the various portions of the frequency spectrum are reassembled by recombining the noise frequency bins. For example a Fourier transform can be performed. The phase however may be incorrect. The phase of the original imaging magnetic resonance data is used. Finally in step 418 the re-synthesized imaging magnetic resonance data is reconstructed into a magnetic resonance image 154. This may be done using the image reconstruction module 162. The steps outlined in steps 400-416 may for instance by performed by the digital filter module 164.

Examples may facilitate elimination of the RF cage by preventing spurious RF signals from interfering with the acquired MRI data which would be present in the magnetic resonance imaging data as noise. A modern MRI system utilizes many channels, typically more than 8, to receive the MRI signal from RF coil elements placed in close proximity to the patient. This close proximity is desirable from the perspective of achieving the highest signal to noise ratio (SNR). Without an RF cage present, spurious RF signals can enter the bore of the MRI system and interfere with the MRI data. To eliminate the subsequent artifacts, the example proposes to introduce and utilize a number of additional receive coil elements at fixed locations within the bore of (or in close proximity to) the MRI system but outside the imaging volume. These additional elements are utilized to acquire only the spurious signals in synchronicity with the acquired MRI data. The acquired pure spurious signals are subsequently utilized to eliminate any spurious contamination of the MRI data.

A standard feature of an MRI system installation is the RF cage. The RF cage is essentially a Faraday cage. In most installations it is typical that the RF cage forms a whole room enclosure surrounding the majority of the MRI system including the magnet and its contents and patient support. A typical MRI suit consists of three rooms. The RF shielded room containing the magnet, the room in which the patient is scanned. The technical room which contains the various auxiliary electronics of the MRI system and the control room where the MRI console and operator sit. The RF cage is typically a relatively large room enclosure made from copper sheet mounted on a wooden frame.

As a consequence of the size and volume of copper used, the RF cage of an MRI installation is an expensive part of the installation. It is therefore advantageous if an alternative means can be used to avoid the need to install the MRI system inside an RF cage.

The RF cage of an MRI system serves two purposes. First it prevents spurious RF signals, from sources other than the MRI system, from interfering with the received MRI signal. Such spurious signals, when within the bandwidth of the sampled MRI signal can appear as artifacts or coherent noise within the MR image. Such signals can spoil image quality, hide anatomical features or appear as pathology. Secondly it prevents the RF energy transmitted by the MRI system from leaking into and disturbing the surroundings.

Examples may relate to elimination of the RF cage all together and focuses on preventing spurious RF signals from interfering with the acquired MRI data. A modern MRI system utilizes many channels, typically more than 8, to receive the MRI signal from RF coil elements placed in close proximity to the patient. This close proximity is desirable from the perspective of achieving the highest signal to noise ratio (SNR). Without an RF cage present, spurious RF signals can enter the bore of the MRI system and interfere with the MRI data. If there are spurious RF signals entering the bore of the MRI system during signal reception, and those spurious RF signals lie within the frequency band of the MRI signal, the RF coil elements will also detect the undesired spurious signal which will typically add to the desired MRI signal. The resulting image will contain artifacts. To eliminate these artifacts examples may introduce and utilize a number of additional receive coil elements at fixed locations within the bore of the MRI system but outside the imaging volume. These elements are referred to as RF sniffer elements (RF noise detection coils) (see FIG. 5).

Figure 5:
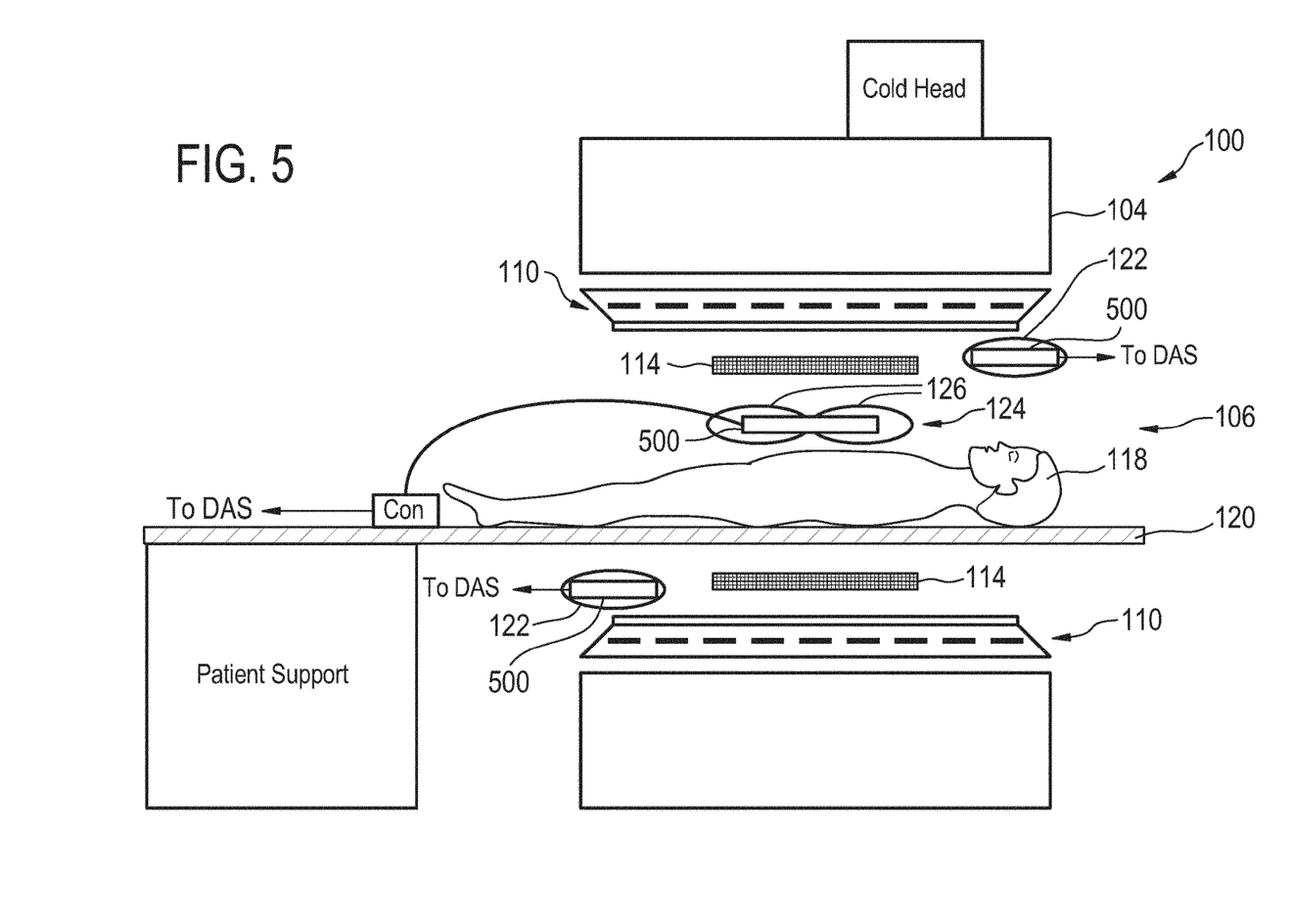
FIG. 5 illustrates a further example of a magnetic resonance imaging system.

FIG. 5 shows a further example of a magnetic resonance imaging system 100. The examples shown in FIG. 5 is similar to that shown in FIG. 1, however the diagram in FIG. 5 shows some additional features not shown in FIG. 1. In particular the RF noise detection coils 122 are shown as having pre-amplifiers 500 that connect to a digital acquisition system. The antenna 124 also has a pre-amplifier 500 connected to its antenna elements 126. This is also connected to a digital acquisition system or radio-frequency system. The magnetic resonance imaging system 100 shown in FIG. 5 comprises the RF noise detection coils 122 and the methods illustrated in FIGS. 2 to 4 may be performed using this system in order to reduce noise caused by spurious RF signals. This may reduce the need for RF shielding of the magnetic resonance imaging system 100.

These additional fixed elements may include dedicated receive channels that behave in an identical manner to those of the coil elements placed on the patient. Channels may be connected to the data acquisition system (DAS) and configured in an identical manner according the requirements of each scanning protocol. Each time MRI data is acquired as part of an image acquisition, the signal from the sniffer elements (RF noise detection coils) is also acquired using identical sampling bandwidth and filtering as the imaging elements. Since the sniffer elements (RF noise detection coils) do not sense the MRI signal, the data they acquire will contain only thermal noise and any spurious RF signal. The imaging elements will contain both MRI signal with the spurious signal super-imposed on top.

Whilst the primary intention of the sniffer elements (RF noise detection coils) is to capture the spurious-only RF signal, it should also be understood that spurious RF signals from any source, including gradient induced spikes, will also be captured and, in principle, can also be eliminated from the desired MRI signal.

It is an assumption of some examples that both the imaging data (imaging magnetic resonance data) and sniffer data (noise radio frequency data) are simultaneously acquired, sampled and stored in digital form for further processing.

Sniffer Based Calibration (RF noise detection coil based calibration): Preferably, prior to acquisition of the MRI data, a number of "dummy" TRs of data (dummy repetitions of data) are acquired using identical sequence timing but without RF excitation (see step 204 in FIG. 2). This can also take place at the end of the scan or both at beginning and the end. This data is valuable in that each of the imaging elements will capture only spurious signal during the dummy (no RF) period. Thus a relationship can be established between the amplitude and phase of the spurious signal captured by the sniffer elements (RF noise detection coils) and relative amplitude and phase of the spurious signal (captured by each of the imaging elements.

General Approach to Spurious Signal Elimination: In its simplest form, elimination of the spurious signal from the MRI signal may involve subtraction (see step 304 in FIG. 3) of the suitably scaled and thresholded sniffer signal from the signal acquired by each imaging element. This can be performed either in the image domain or the k-space domain. However, two factors may serve to frustrate this simple approach. 1) The amplitude and phase of the spurious signal captured by each imaging element will be different from the signal captured by the sniffer elements and 2) The spurious signal may change its temporal characteristics during the course of the scan. A spurious signal may be considered to be an example of an RF noise event.

Spurious Signal Elimination via Synthesized Time Course: This complication can be addressed by utilizing the imaging element data (calibration magnetic resonance data), acquired during the dummy periods, together with the sniffer data (noise radio frequency data and reference radio frequency data) that was acquired throughout the whole time course of data acquisition. An important part of the data processing takes the sniffer signal time course and thresholds the signal leaving only the signal that remains above a chosen fraction of the noise floor. We establish the sniffer signal that was acquired in parallel with the imaging element signal during the "dummy" calibration period as a baseline set of synchronized data. The subsequently acquired and thresholded sniffer signals are compared by successive complex subtraction to determine the evolution in amplitude and phase of each component of spurious signal. Thus a time course of relative change in amplitude and phase of the spurious signal is established from the sniffer signal. This same time course is then used to successively scale the stored spurious data that was acquired from each imaging element during the calibration period. By this method it is possible to synthesize the effective spurious signal evolution at each imaging element throughout the whole scan.

It is not necessary to wait for the whole scan to complete. Spurious signal correction can be performed during acquisition.

For illustration we define a scan of N repeated data acquisition periods. In case of a field echo (FFE) scan this would be equivalent to N TRs. For convenience we define the imaging data (imaging magnetic resonance data) as the data acquired between n=1 to N. We define the spurious reference calibration data (calibration magnetic resonance data) as the data acquired at or before n=0. For this illustration we arbitrarily specify that each data acquisition period consists of an acquisition window of 256 complex data samples.

We also define a total of R receiving elements where the elements indexed from r=1 up to R are the imaging elements (antenna element) while the element indexed r=0 is the sniffer element.

The signal of any element (antenna element) can be indexed as a function of both n and r such that: Sp(0, 0) represents the spurious signal acquired by the sniffer element (RF noise detection coil) during the dummy calibration period. For each imaging element there is also a spurious reference calibration signal, Sp(0, r=1 . . . R), acquired during the same dummy period.

In any TR period (n>1) and for each imaging element (r>1) the contribution of spurious signal to the sampled signal at any coil element can be estimated by:

dSp(n, r=1 . . . R)=Sp(0, r=1 . . . R)×Sp(n, 0)/Sp(0, 0)

where complex mathematics is assumed. The data sampled from each of the imaging elements during the period n>1, let's call this Aq(n, r=1 . . . R), will contain both the desired MR signal from each location, Cl(n, r=1 . . . R), plus the actual undesired spurious signal dSp‡(n, r=1 . . . R) sampled at each imaging element. Thus:

$$Aq(n,r=1 \ldots R)=Cl(n,r=1 \ldots R)+Sp\ddagger(n,r=1 \ldots R)$$

In general, the spurious contribution to each imaging element at each sample time can be estimated from the synthesized data obtained from the dummy calibration period and the ongoing sniffer coil measurements (noise radio frequency data)

$$Sp\ddagger(n,r=1 \ldots R)\approx dSp(n,r=1 \ldots R)$$

The clean MR signal can thus be recovered from each imaging element by complex subtraction of the associated synthesized spurious signal time series.

$$Cl(n,r=1 \ldots R)=Aq(n,r=1 \ldots R)-dSp(n,r=1 \ldots R)$$

There are various options in performing the correction, depending on the architecture of the DAS. In one embodiment, all the data is stored and the corrections performed during reconstruction. In a preferred embodiment, since all necessary information for correcting the data within a TR (repetition of the pulse sequence) is available at the end of each TR (provided n>0), corrections per TR can be performed on-the-fly before the corrected data is sent to the reconstruction engine.

Figure 6:
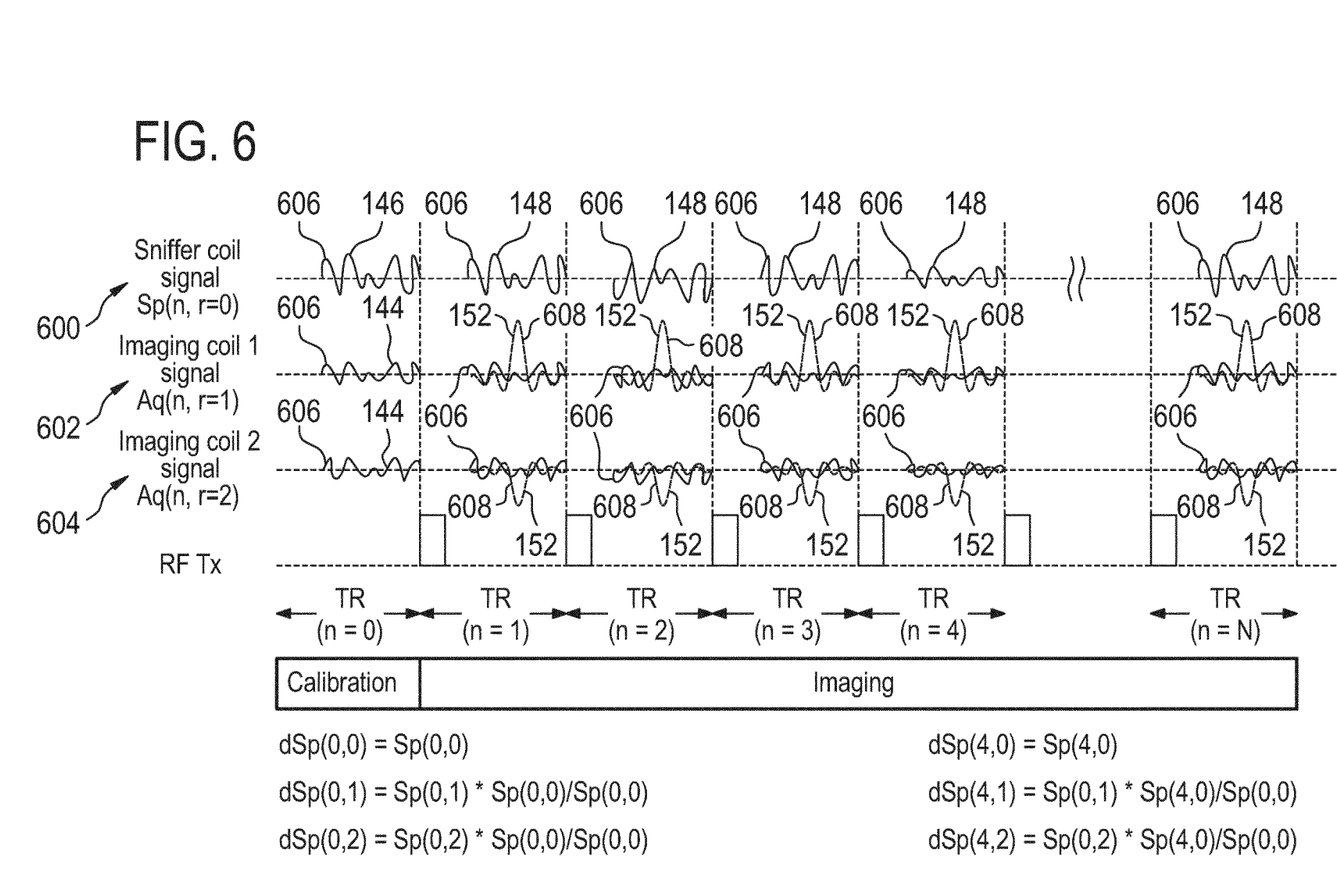
FIG. 6 shows a graphical illustration of how the various spurious contributions to the signals of each imaging element can be removed.

FIG. 6 is a graphical illustration of how the various spurious contributions to the signals of each imaging element can be untangled as long as a sniffer signal is available per TR and the MR signal independent (without RF excitation) spurious signals are calibrated per imaging coil element within the calibration period.

FIG. 6 shows a graphical illustration of how the various spurious contributions to the signals of each imaging element can be removed as long as a sniffer signal or signal from a RF noise detection coil is available per TR or repetition and the magnetic resonance signal independent without RF excitation. Spurious signals are calibrated per imaging coil element within the calibration. Row 600 shows the sniffer coil signal. Row 602 shows the signal on imaging coil 1. Row 604 shows the signal on imaging coil 2. Noise is labeled 606 and the clean magnetic resonance imaging signal is labeled 608. Examples of the estimation of dSp are shown when n=0 and n=4.

During the first repetition TR n=0 the reference radio-frequency data 146 and the calibration magnetic resonance data 144 are acquired. In the subsequent repetitions the sniffer coil signal 600 acquires noise radio-frequency data 148 at the same time that imaging magnetic resonance data is acquired. The imaging magnetic resonance data is shown in each case as being the sum of the clean or corrected imaging magnetic resonance data 152 and a noise signal 606.

Some additional details are relevant for the correct functioning of the proposed example. For MRI at static field strengths above 0.1 T the dominant source of broadband thermal noise originates from the sample itself. In general the noise figure of the pre-amplifier is designed to be lower than this sample noise source so that the sample noise dominates. For a coil element, such as intended for the sniffer coil, when at a location not close to the patient, the dominant thermal noise source, therefore, will be from the pre-amplifier. In this case, all other signal present can be considered as the external spurious noise.

It is also beneficial if the spurious noise signal remains within the dynamic range of the receivers.

Examples may have one or more of the following features:

1. A hardware configuration and signal processing method that eliminates spurious signal from the MR data acquired from at least one receiving element in the case that an RF cage is not present.
2. The same method is also suitable for the elimination of the effect of gradient system induced spikes.
3. Said method uses at least one "sniffer" coil that detects only signals external to the imaging volume of the MR system.
4. Said method utilizes at least one sniffer receiving coil that is mounted in a location where it cannot detect MR signal.
5. Said sniffer coil is connected to the data acquisition system (DAS) and signal from said coil is acquired simultaneously with that from all receiving coil elements.
6. Data for said sniffer coil is acquired continuously.
7. Said correction method optionally performs a calibration acquisition in which no RF excitation takes place thereby enabling the relative spurious signal contributions from each receiving element to be established.
8. Said calibration can take place prior to clinical data acquisition or post.
9. Said calibration takes place on a per patient basis.
10. Processing to eliminate spurious signal can be performed either after completion of the complete scan or periodically during the scan.

In some examples, the RF noise detection coil or sniffer coil may have the following features:

1.) Be far enough away from the imaging zone so that what it measures is the noise and not the MR signal (or at least that the MR signal is small compared to the noise measurements and
2.) Be similar to the MR coil in that the noise signal (noise radio frequency data) measured by the sniffer (RF noise detection coil) is comparable to the noise received by the MR coil.

Some examples may rely on the noise at the sniffer coil being uniform with the noise at the MR coil. In other words the RF noise detection coil and the magnetic resonance antenna are considered to both be in the far field of the noise source.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
110 magnetic field gradient coils
112 magnetic field gradient coil power supply
114 body coil
116 transceiver
118 subject
120 subject support
122 RF noise detection coil
124 magnetic resonance image coil
126 antenna element
130 computer
132 hardware interface
134 user interface
136 computer storage
138 computer memory
140 pulse sequence data
142 imaging magnetic resonance data
144 calibration magnetic resonance data
146 reference radio frequency data
148 noise radio frequency data
150 noise calibration
152 corrected imaging magnetic resonance data
154 magnetic resonance image
160 control module
162 image reconstruction module
164 digital filter module
200 acquire imaging magnetic resonance data by controlling the magnetic resonance imaging system with the pulse sequence data with radio frequency excitation of the radio frequency system enabled
202 acquire noise radio frequency data using the at least one RF noise detection coil simultaneously with the imaging magnetic resonance data
204 acquire calibration magnetic resonance data by controlling the magnetic resonance imaging system with the pulse sequence data with radio frequency excitation of the radio frequency system disabled
206 acquire reference radio frequency data using the at least one RF noise detection coil simultaneously with the calibration magnetic resonance data
208 calculate a noise calibration using the reference radio frequency data and the calibration magnetic resonance data
300 detect one or more RF noise events using the noise radio frequency data
302 determine a noise event phase, a noise event frequency, and a noise amplitude for each of the one or more RF noise events
304 correct each of the RF noise events in the imaging magnetic resonance data using the noise calibration and the noise event phase, noise event frequency, and the noise event amplitude
306 reconstruct magnetic resonance image from the corrected imaging magnetic resonance data
400 divide the noise radiofrequency data into noise temporal frames
402 divide the imagining magnetic resonance data into data temporal frames
404 calculate a short-time measured noise spectrum for each of the noise temporal frames
406 calculate a short-time calculated noise spectrum for each short-time measured noise spectrum using the noise calibration
408 calculate a short-time data spectrum for each of the data temporal frames
410 binning each short-time calculated noise spectrum into noise frequency bins
412 binning each short-time data spectrum into data frequency bins
414 calculate corrected data frequency bins by subtracting the noise frequency bins from the data frequency bins using identical frequency bins; and
416 resynthesize the imaging magnetic resonance data using the corrected data frequency bins and an original phase spectrum of the imaging magnetic resonance data
418 reconstruct the resynthesized imaging magnetic resonance data into a magnetic resonance image
500 pre-amplifier
600 sniffer coil signal
602 imaging coil 1 signal
604 imaging coil 2 signal
606 noise
608 MR signal

The invention claimed is:

1. A magnetic resonance imaging system for acquiring magnetic resonance data from an imaging zone, the magnetic resonance imaging system comprising:
a magnet for generating a main magnetic field in the imaging zone;
a radio frequency system comprising a magnetic resonance antenna for sending and receiving radio frequency transmissions within a predetermined bandwidth, wherein the magnetic resonance antenna comprises at least one antenna element, wherein the at least one antenna element is within the imaging zone;
at least one RF noise detection coil for detecting radio-frequency signals within the predetermined bandwidth, wherein the at least one RF noise detection coil is positioned in or near a bore of the magnet outside of the imaging zone;
a non-transitory computer readable memory containing machine executable instructions and pulse sequence data;
a processor for controlling the magnetic resonance imaging system, wherein execution of the instructions causes the processor to:
acquire imaging magnetic resonance data by controlling the magnetic resonance imaging system with the pulse sequence data with radio frequency excitation of the radio frequency system enabled;

acquire noise radio frequency data using the at least one RF noise detection coil, wherein the noise radio frequency data is acquired simultaneously with the imaging magnetic resonance data;
acquire calibration magnetic resonance data by controlling the magnetic resonance imaging system with the pulse sequence data with radio frequency excitation of the radio frequency system disabled;
acquire reference radio frequency data using the at least one RF noise detection coil, wherein the reference radio frequency data is acquired simultaneously with the calibration magnetic resonance data;
calculate a noise calibration using the reference radio frequency data and the calibration magnetic resonance data to establish a relationship between amplitude and phase of the reference radio frequency data captured by the at least one RF noise detection coil and relative amplitude and phase of the magnetic resonance data; and
correct RF noise events in the imaging magnetic resonance data using the noise calibration.

2. The magnetic resonance imaging system of claim 1, wherein the noise calibration is frequency dependent, phase dependent, and amplitude dependent; wherein execution of the instructions further causes the processor to:
detect the RF noise events using the noise radio frequency data;
determine a noise event phase, a noise event frequency, and a noise amplitude for each of the RF noise events; and
correct each of the detected RF noise events in the imaging magnetic resonance data using the noise calibration and the noise event phase, the noise event frequency, and the noise event amplitude.

3. The magnetic resonance imaging system of claim 2, wherein calculating the noise calibration comprises determining a frequency dependent mapping that is descriptive of phase and amplitude measurements made with the at least one RF noise detection coil and each of the at least one antenna element.

4. The magnetic resonance imaging system of claim 3, wherein correcting each of the RF noise events comprises:
calculating a temporally dependent noise signal for each of the at least one antenna element using the noise calibration and the noise event phase, the noise event frequency, and the noise event amplitude; and
subtracting the temporally dependent noise signal from the imaging magnetic resonance data.

5. The magnetic resonance imaging system of claim 4, wherein subtracting the temporally dependent noise signal from the imaging magnetic resonance data is performed in k-space.

6. The magnetic resonance imaging system of claim 4, wherein execution of the instructions cause the processor to subtract the temporally dependent noise signal from the imaging magnetic resonance data by:
transforming the imaging magnetic resonance data into a preliminary magnetic resonance image;
transforming the temporally dependent noise signal into a noise image; and
calculating a final magnetic resonance image by subtracting the noise image from the preliminary magnetic resonance image.

7. The magnetic resonance imaging system of claim 1, wherein the RF noise events are determined by thresholding the reference radio frequency data.

8. The magnetic resonance imaging system of claim 1, wherein execution of the machine executable instructions further causes the processor to:
divide the noise radio frequency data into noise temporal frames;
divide the imagining magnetic resonance data into data temporal frames, wherein there is a data temporal frame of the data temporal frames that corresponds in time to a noise temporal frame of the noise temporal frames;
calculate a short-time measured noise spectrum for each of the noise temporal frames;
calculate a short-time calculated noise spectrum for each short-time measured noise spectrum using the noise calibration;
calculate a short-time data spectrum for each of the data temporal frames;
bin each short-time calculated noise spectrum into noise frequency bins;
bin each short-time data spectrum into data frequency bins, wherein the short-time calculated noise spectrum and the short-time data spectrum are binned using identical frequency bins;
calculate corrected data frequency bins by subtracting the noise frequency bins from the data frequency bins using identical frequency bins; and
resynthesize the imaging magnetic resonance data using the corrected data frequency bins and an original phase spectrum of the imaging magnetic resonance data.

9. The magnetic resonance imaging system of claim 1, wherein the magnet is a cylindrical magnet with the bore, wherein the magnetic resonance antenna is a body coil located within the bore, and wherein the at least one antenna element is positioned within the bore.

10. The magnetic resonance imaging system of claim 1, wherein the magnetic resonance antenna is a surface coil, wherein the at least one antenna element is a loop antenna element, and wherein each of the at least one RF noise detection coil is a loop antenna.

11. The magnetic resonance imaging system of claim 1, wherein the predetermined bandwidth is between 1 kHz and 1 MHz.

12. The magnetic resonance imaging system of claim 1, wherein either the imaging magnetic resonance data or the calibration magnetic resonance data is acquired first.

13. The magnetic resonance imaging system of claim 1, wherein execution of the instructions further causes the processor to reconstruct a magnetic resonance image using the imaging magnetic resonance data.

14. A computer program product comprising machine executable instructions stored on a computer readable medium for execution by a processor controlling a magnetic resonance imaging system, wherein the magnetic resonance imaging system comprises: a magnet for generating a main magnetic field in an imaging zone; a radio frequency system comprising a magnetic resonance antenna for sending and receiving radio frequency transmissions within a predetermined bandwidth, wherein the magnetic resonance antenna comprises at least one antenna element that is positioned within the imaging zone; at least one RF noise detection coil for detecting radio-frequency signals within the predetermined bandwidth, wherein the at least one RF noise detection coil is positioned in or near a bore of the magnet outside of the imaging zone; and a memory containing pulse sequence data; wherein execution of the machine executable instructions cause the processor to:
acquire imaging magnetic resonance data by controlling the magnetic resonance imaging system with the pulse sequence data with radio frequency excitation of the radio frequency system enabled;

acquire noise radio frequency data using the at least one RF noise detection coil, wherein the noise radio frequency data is acquired simultaneously with the imaging magnetic resonance data;

acquire calibration magnetic resonance data by controlling the magnetic resonance imaging system with the pulse sequence data with the radio frequency excitation of the radio frequency system disabled;

acquire reference radio frequency data using the at least one RF noise detection coil, wherein the reference radio frequency data is acquired simultaneously with the calibration magnetic resonance data; and calculate a noise calibration using the reference radio frequency data and the calibration magnetic resonance data to establish a relationship between amplitude and phase of the reference radio frequency data captured by the at least one RF noise detection coil and relative amplitude and phase of the calibration magnetic resonance data.

15. A method of operating a magnetic resonance imaging system for acquiring magnetic resonance data from an imaging zone, wherein the magnetic resonance imaging system comprises: a magnet for generating a main magnetic field in the imaging zone; a radio frequency system comprising a magnetic resonance antenna for sending and receiving radio frequency transmissions within a predetermined bandwidth, wherein the magnetic resonance antenna comprises at least one antenna element, wherein the at least one antenna element is within the imaging zone; at least one RF noise detection coil for detecting radio-frequency signals within the predetermined bandwidth, wherein the at least one RF noise detection coil is positioned in or near a bore of the magnet outside of the imaging zone; wherein the method comprises:

acquiring imaging magnetic resonance data by controlling the magnetic resonance imaging system with the pulse sequence data with radio frequency excitation of the radio frequency system enabled;

acquiring noise radio frequency data using the at least one RF noise detection coil, wherein the noise radio frequency data is acquired simultaneously with the imaging magnetic resonance data;

acquiring calibration magnetic resonance data by controlling the magnetic resonance imaging system with the pulse sequence data with the radio frequency excitation of the radio frequency system disabled;

acquiring reference radio frequency data using the at least one RF noise detection coil, wherein the reference radio frequency data is acquired simultaneously with the calibration magnetic resonance data; and calculating a noise calibration using the reference radio frequency data and the calibration magnetic resonance data to establish a relationship between amplitude and phase of the reference radio frequency data captured by the at least one RF noise detection coil and relative amplitude and phase of the calibration magnetic resonance data; and correct RF noise events in the imaging magnetic resonance data using the noise calibration and the noise event phase, noise event frequency, and the noise event amplitude.

* * * * *